United States Patent
Kawahara et al.

(10) Patent No.: US 6,709,991 B1
(45) Date of Patent: Mar. 23, 2004

(54) METHOD OF FABRICATING SEMICONDUCTOR DEVICE WITH CAPACITOR

(75) Inventors: Jun Kawahara, Tokyo (JP); Shinobu Saito, Tokyo (JP); Yukihiko Maejima, Tokyo (JP); Yoshihiro Hayashi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/084,578

(22) Filed: May 26, 1998

(30) Foreign Application Priority Data

May 23, 1997 (JP) ............................................... 9-133637

(51) Int. Cl.⁷ ............................................. H01L 21/469
(52) U.S. Cl. ..................................................... 438/791
(58) Field of Search ................................ 438/787, 790, 438/791, 793, 794, 706, 723, 737, 743

(56) References Cited

U.S. PATENT DOCUMENTS

| | | | | |
|---|---|---|---|---|
| 3,574,677 A | * | 4/1971 | Pammer et al. | 117/201 |
| 5,270,238 A | | 12/1993 | Kim | 437/52 |
| 5,610,099 A | * | 3/1997 | Stevens et al. | 438/626 |
| 6,103,566 A | * | 8/2000 | Tamaru et al. | 438/240 |

FOREIGN PATENT DOCUMENTS

| | | | |
|---|---|---|---|
| CN | 1102731 A | 5/1995 | H01L/27/00 |
| JP | H4-102367 | 4/1992 | H01L/27/108 |
| JP | H5-183106 | 7/1993 | H01L/27/04 |
| JP | H6-151383 | 5/1994 | H01L/21/302 |
| JP | 750391 | 2/1995 | H01L/27/04 |
| JP | 7235527 | 9/1995 | H01L/21/3065 |
| JP | H8-17806 | 1/1996 | H01L/21/3065 |
| JP | H8-037282 | 2/1996 | H01L/27/04 |
| JP | 8213557 | 8/1996 | H01L/27/04 |
| JP | H8-264522 | 10/1996 | H01L/21/312 |
| JP | 8264734 | 10/1996 | H01L/27/108 |
| JP | H9-312381 | 12/1997 | H01L/27/108 |
| JP | H10-12844 | 1/1998 | H01L/27/108 |
| JP | H10-173139 | 6/1998 | H01L/27/10 |
| KR | 92-22479 | 12/1992 | H01L/23/52 |

OTHER PUBLICATIONS

Wolf, S., Tauber, R. Silicon Processing for the VLSI Era, vol. 1: Process Technology. Lattice Press, 1986, p. 546.*
Fujino, K.; Nishimoto, Y.; Tokumasu, N.; Maeda, K.. Dependence of Deposition Rate on Base Materials in TEOS/O3 AP CVD. IEEE VMIC Conference, Jun. 12–13, 1990. pp. 187–193.*
Impact of Post Processing Damages on the Performance of High Dielectric Constant PLZT Thin Film Capacitors for ULSI Dram Application Khamankar et al; IEDM 1994; pp. 337–340.

* cited by examiner

Primary Examiner—Long Pham
Assistant Examiner—Ginette Peralta
(74) Attorney, Agent, or Firm—Hayes Soloway P.C.

(57) ABSTRACT

A fabrication method of a semiconductor device with a capacitor is provided, which prevents leakage current from increasing and dielectric breakdown resistance from decreasing during a CVD or dry etching process for forming an insulating film to cover the capacitor. In this method, a lower electrode of a capacitor is formed on a first insulating film. The first insulating film is typically formed on or over a semiconductor substrate. A dielectric film of the capacitor is formed on the lower electrode to be overlapped therewith. An upper electrode of the capacitor is formed on the dielectric film to be overlapped therewith. A second insulating film is formed to cover the capacitor by a thermal CVD process in an atmosphere containing no plasma at a substrate temperature in which hydrogen is prevented from being activated due to heat. A source material of the second insulating film has a property that no hydrogen is generated in the atmosphere through decomposition of the source material during the thermal CVD process.

4 Claims, 17 Drawing Sheets

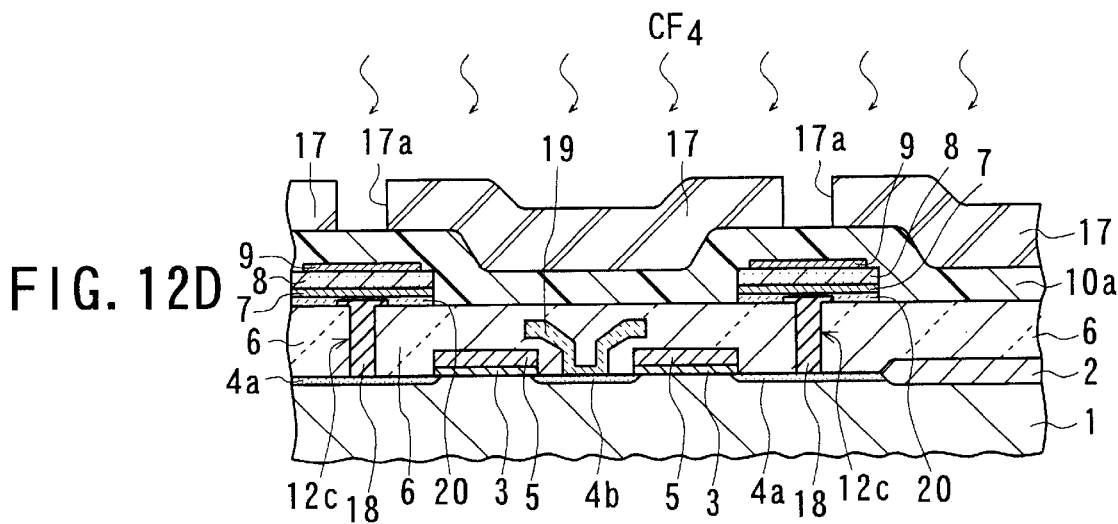
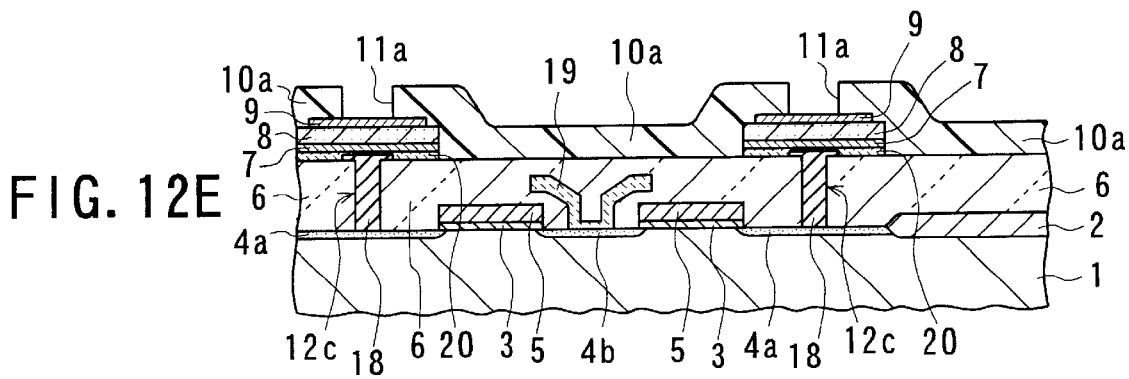
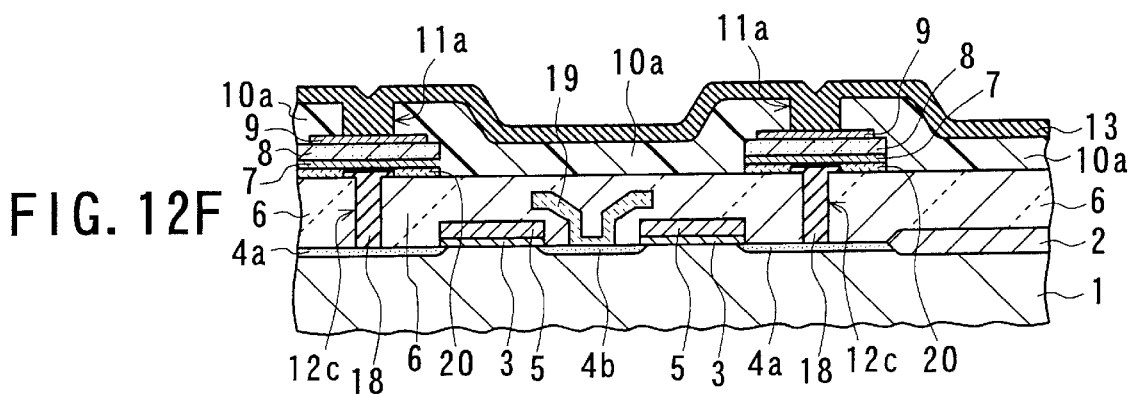

METHOD OF FABRICATING SEMICONDUCTOR DEVICE WITH CAPACITOR

BACKGROUND OF THE INVENTION

1. Field of the Invention

The present invention relates to a method of fabricating a semiconductor device and more particularly, to a method of fabricating a semiconductor device having a capacitor equipped with a dielectric film made of a high dielectric-constant or ferroelectric material.

2. Description of the Related Art

A conventional semiconductor memory device Including a storage capacitor equipped with a ferroelectric film as a capacitor dielectric is disclosed In the Japanese Non-Examined Patent Publication No. 7-50391 published in February 1995. In this memory device, the storage capacitor is implemented by using conventional fabrication processes or techniques for silicon-based semiconductor integrated circuit devices.

This conventional memory device utilizes the residual polarization of a ferroelectric film for storing the information. The ferroelectric film is applied with a positive or negative bias voltage to thereby cause polarization in the ferroelectric film. The polarization thus caused in the ferroelectric film is left due to the residual polarization even after the application of the bias voltage is stopped, This means that this memory device serves as a non-volatile memory.

FIG. 1 shows the configuration of the conventional semiconductor memory device disclosed in the Japanese Non-Examined Patent Publication No. 7-50391.

In FIG. 1, an isolation insulating film 102 is formed on a single-crystal silicon substrate 101 to define an active region. In the active region, a source region 104a and a drain region 104b are formed in the substrate 101, and a gate electrode 105 is formed over the substrate 101 through a gate insulating film 103 between the source and drain regions 104a and 104b, thereby forming a Metal-Oxide-Semiconductor Field-Effect Transistor (MOSFET).

An interlayer insulating film 106 is formed to cover the MOSPET and the isolation insulating film 102.

A lower electrode 107 of a storage capacitor is formed on the interlayer insulating film 106. A ferroelectric film 108 of the storage capacitor is formed on the lower electrode 107 to be partially overlapped therewith. An upper electrode 109 of the storage capacitor is formed on the ferroelectric film 108 to be entirely overlapped therewith.

A first protection film 115 is formed on the interlayer insulating film 106 to cover the storage capacitor and the MOSFET.

A metallic wiring film 113a is formed on the first protection film 115 to be electrically connected to the upper electrode 109 of the capacitor through a contact hole 111a and the source region 104a of the MOSFET through a contact hole 112a. The contact hole 111a penetrates the first protection film 115 alone. The contact hole 112a penetrates the first protection film 115 and the interlayer insulating film 106.

A metallic wiring film 113b is formed on the first protection film 115 to be electrically connected to the lower electrode 107 of the capacitor through a contact hole 111b. The contact hole 111b penetrates the first protection film 115 alone.

A metallic wiring film 114 is formed on the first protection film 115 to be electrically connected to the drain region 104b of the MOSFET through a contact hole 112b. The contact hole 112b penetrates the first protection film 115 and the interlayer insulating film 106.

A silicon dioxide ($SiO_2$) subfilm 116a, which is doped with phosphorus (P), is formed on the first protection film 115 to cover the metallic wiring films 113a, 113b, and 114. Another $SiO_2$ subfilm 116b, which is not doped with phosphorus, is formed on the $SiO_2$ subfilm 116a. These two $SiO_2$ subfilms 116a and 116b constitute a second protection film 116.

As the first protection film 115, a silicon dioxide ($SiO_2$) or silicon nitride ($SiN_x$) is typically used. A silicon oxide or silicon nitride film is usually formed by a Chemical Vapor Deposition (CVD) process using a gaseous source, a sputtering process using a solid source, or a coating and sintering process using a liquid source.

With the CVD process for $SiO_2$ or $SiN_x$ using a gaseous source, a source gas for silicon (Si) tends to contain hydrogen (H) or hydrogen compound chemically bonded with silicon serving as a film formation species. A typical example of the source gas for silicon is mono-silane ($SiH_4$). The source gas for Si is usually decomposed during the CVD process with the use of heat or plasma.

It has been known that a lot of activated hydrogen (i.e., hydrogen radical) tends to be generated in an atmosphere during a gas-source CVD process using a hydrogen-containing source gas for silicon, and the activated hydrogen thus generated reduces the ferroelectric film 108 of the storage capacitor to thereby degrade the performance or characteristics of the capacitor.

The effect of hydrogen to lanthanum-doped lead zirconate titanate (PZT, $PbZr_{1-x}Ti_xO_3$), i.e., PLZT, was reported in an article, International Electron Devices Meeting (IEDM), Technical Digest, December 1994, pp. 337–340, which was written by R. Khamankar et al. and entitled "IMPACT OF POST PROCESSING DAMAGES ON THE PERFORMANCE OF HIGH DIELECTRIC CONSTANT PLZT THIN FILM CAPACITORS FOR ULSI DRAM APPLICATIONS".

This article describes the effect of hydrogen, nitrogen ($N_2$) plasma, and x-ray to a semiconductor memory device equipped with a ferroelectric storage capacitor including a PLZT film, and the polarization degradation of the PLZT film and the leakage-current increase of the storage capacitor. This article also describes the repair of the damage or degradation of the PLZT film or capacitor thus caused by a specific thermal annealing process.

FIG. 2 shows the relationship of the polarization degradation $Q_c'$ of the PLZT film of the hydrogen-damaged device with the bias voltage applied thereto while using the annealing temperature as a parameter, The memory device is exposed to a forming gas made of 5% hydrogen ($H_2$) and 95% nitrogen ($N_2$), and is damaged due to hydrogen in the forming gas. The thermal annealing process is performed in an atmosphere containing nitrogen ($N_2$) or oxygen ($O_2$). The word "FRESH" in FIG. 2 means the case where the memory device 19 not damaged due to exposure to hydrogen.

FIG. 3 shows the relationship of the leakage current density of the storage capacitor of the damaged device with the lanthanum (La) concentration of the PLZT film. The memory device is exposed to the $H_2/N_2$ forming gas, $N_2$ plasma, or x-ray. The word "FRESH" in FIG. 3 means the case where the memory device is not damaged due to exposure to hydrogen, plasma, nor x-ray.

Since each of PZT and PLZT is a composite metallic oxide, it tends to be reduced by activated hydrogen contained in the atmosphere. Due to this reduction, oxygen is released from the matrix of the oxide to thereby form defects. As a result, electrons tend to become unstable due to the defects thus formed, degrading the electric insulating capability. This leads to the decrease in polarization and increase in leakage current.

To form the contact holes 111a and 111b penetrating the protection film 115 in the conventional semiconductor memory device shown in FIG. 1, the protection film 115 needs to be etched by a wet process using a liquid such as an acid or a dry process using plasma. It is needless to say that the dry process is preferred to the wet process, because of its higher fabrication yield.

In a conventional dry etching processes, a fluorocarbon-system gas is typically used as an etching gas. For example, to ensure a satisfactorily high selection ratio between silicon and silicon oxide, it is typical that the etching gas contains hydrogen. For example, trifluoromethane ($CHF_3$) alone or a mixture of trifluoromethane and hydrogen is often used.

Similar to the above-described case of the gas-source CVD process using a hydrogen-containing source gas for silicon, activated hydrogen tends to be generated in an etching atmosphere, and the activated hydrogen reduces the ferroelectric film 108 of the storage capacitor. As a result, the polarization of the ferroelectric film 108 is decreased and at the same time, the leakage current of the storage capacitor is increased and the dielectric breakdown resistance thereof is lowered.

SUMMARY OF THE INVENTION

Accordingly, an object of the present invention is to provide a method of fabricating a semiconductor device with a capacitor that prevents the performance degradation of the capacitor that may be caused during the fabrication process sequence.

Another object of the present invention is to provide a method of fabricating a semiconductor device with a capacitor that prevents the leakage current from increasing and the dielectric breakdown resistance from decreasing during a CVD or dry etching process for forming an insulating film to cover the capacitor.

Still another object of the present invention is to provide a method of fabricating a semiconductor device with a ferroelectric capacitor that prevents the polarization of the ferroelectric capacitor from degrading.

The above objects together with others not specifically mentioned will become clear to those skilled in the art from the following description.

A method of fabricating a semiconductor device according to a first aspect of the present invention is comprised of the following steps (a) to (d):
(a) A lower electrode of a capacitor is formed on a first insulating film. The first insulating film is typically formed on or over a semiconductor substrate.
(b) A dielectric or ferroelectric film of the capacitor is formed on the lower electrode to be overlapped therewith.
(c) An upper electrode of the capacitor is formed on the dielectric or ferroelectric film to be overlapped therewith.
(d) A second insulating film is formed to cover the capacitor by a thermal CVD process in an atmosphere containing no plasma at a substrate temperature in which hydrogen is prevented from being activated due to heat.
A source material of the second insulating film has a property that no hydrogen is generated in the atmosphere through decomposition of the source material during the thermal CVD process.

With the method of fabricating a semiconductor device according to the first aspect of the present invention, the second insulating film is formed to cover the capacitor by a thermal CVD process in an atmosphere containing no plasma at a substrate temperature in which hydrogen is prevented from being activated due to heat. The source material of the second insulating film has a property that no hydrogen is generated in the atmosphere through decomposition of the source material during the thermal CVD process.

As a result, the dielectric or ferroelectric film is not reduced by the activated hydrogen existing in the atmosphere during the thermal CVD process. Thus, the leakage current is prevented from increasing and the dielectric breakdown resistance is prevented from degreasing during the CVD process for forming the second insulating film to cover the capacitor. This means that the performance degradation of the capacitor is prevented from occurring.

Moreover, when the capacitor has a ferroelectric film, in other words, the capacitor is a ferroelectric capacitor, the dielectric or residual polarization of the forroelectric capacitor is prevented from degrading. This is also because the dielectric or ferroelectric film is not reduced by the activated hydrogen existing in the atmosphere during the thermal CVD process.

In a preferred embodiment of the method according to the first aspect of the present invention, the second insulating film is $SiO_2$, and the substrate temperature is in a range of 300 to 500° C.

When the substrate temperature is lower than 300° C., the $SiO_2$ film tends to contain a large amount of water, degrading the quality of the $SiO_2$ film. When the substrate temperature is higher than 500° C., the deposition or growth rate of the $SiO_2$ film is excessively low and the step coverage tends to degrade.

As the source material of the second insulating film of $SiO_2$,
 tetraethyl orthosilicate (TEOS) $[Si(OC_2H_5)_4]$,
 hexamethyldisiloxane $[(CH_3)_3SiOSi(CH_3)_3]$,
 diacetoxydibutoxysilane $[Si(OC_3H_7)_2(OCOCH_3)_2]$, or
 tetraisocyanatesilane $Si(NCO)_4$ may be preferably used.

In another preferred embodiment of the method according to the first aspect of the present invention, the second insulating film is $SiN_x$, and the substrate temperature is in a range of 500 to 750° C.

When the substrate temperature is lower than 500° C., the deposition or growth rate of the $SiN_x$ film is excessively low.

When the substrate temperature is higher than 750° C., there arises a possibility that hydrogen is activated by heat to thereby cause reduction of the $SiN_x$ film.

As the source material of the second insulating film of $SiN_x$, silicon diamide complex $[(Si(NMe_2)_{4-n}H_n]$, where n is zero or a positive integer (i.e., 0, 1, 2, . . .) may be preferably used.

A method of fabricating a semiconductor device according to a second aspect of the present invention is comprised oft he following steps (a) to (e):
(a) A lower electrode of a capacitor is formed on a first insulating film. The first insulating film is typically formed on or over a semiconductor substrate,
(b) A dielectric or ferroelectric film of the capacitor is formed on the lower electrode to be overlapped therewith.
(c) An upper electrode of the capacitor is formed on the dielectric or ferroelectric film to be overlapped therewith.
(d) A second insulating film is formed to cover the capacitor.
(e) A contact hole for contacting one of the lower and upper electrodes of the capacitor is formed by selectively removing the second insulating film by a dry etching process using an etching gas containing no hydrogen nor plasma.

The etching gas has a property that no hydrogen is generated through decomposition of the etching gas during the dry etching process.

With the method of fabricating a semiconductor device according to the second aspect of the present invention, the contact hole for contacting one of the lower and upper electrodes of the capacitor is formed by selectively removing the second insulating film by a dry etching process usingian etching gas containing no hydrogen. The etching gas has a property that no hydrogen is generated through decomposition of the etching gas during the dry etching process.

As a result, the dielectric or ferroelectric film of the capacitor is not reduced by the activated hydrogen existing in the atmosphere during the dry etching process. Thus, the leakage current is prevented from increasing and the dielectric breakdown resistance is prevented from degreasing during the dry etching process for forming the contact hole. This means that the performance degradation of the capacitor is prevented from occurring.

Moreover, when the capacitor has a ferroelectric film, in other words, the capacitor is a ferroelectric capacitor, the dielectric or residual polarization of the ferroelectric capacitor is prevented from degrading. This is also because the dielectric or ferroelectric film is not reduced by the activated hydrogen existing in the atmosphere during the thermal CVD process.

In a preferred embodiment of the method according to the second aspect of the present invention, the second insulating film is $SiO_2$, and the etching gas is comprised of a composition of carbon (C) and fluorine (F). For example, $CF_4$ and $C_2F_6$ may be used. Oxygen may be added to $CF_4$ or $C_2F_6$.

In another preferred embodiment of the method according to the second aspect of the present invention, the second insulating film is $SiN_x$, the etching gas is comprised of a composition of carbon (C) and fluorine (F). For example, $CF_4$ and $SiF_4$, or $(NF_3+Cl_2)$ may be used. Oxygen may be added to $CF_4$. Oxygen and nitrogen may be added to $CF_4$.

As the dielectric film having a higher dielectric constant than $SiO_2$ and $Si_3N_4$, an oxide of a single metal such as $Ta_2O_5$ may be used.

As the ferroelectric film, any ferroelectric film such as FZT, PLZT, SBT ($SrBi_2Ta_2O_9$), and BTO($BaTiO_3$) may be used.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
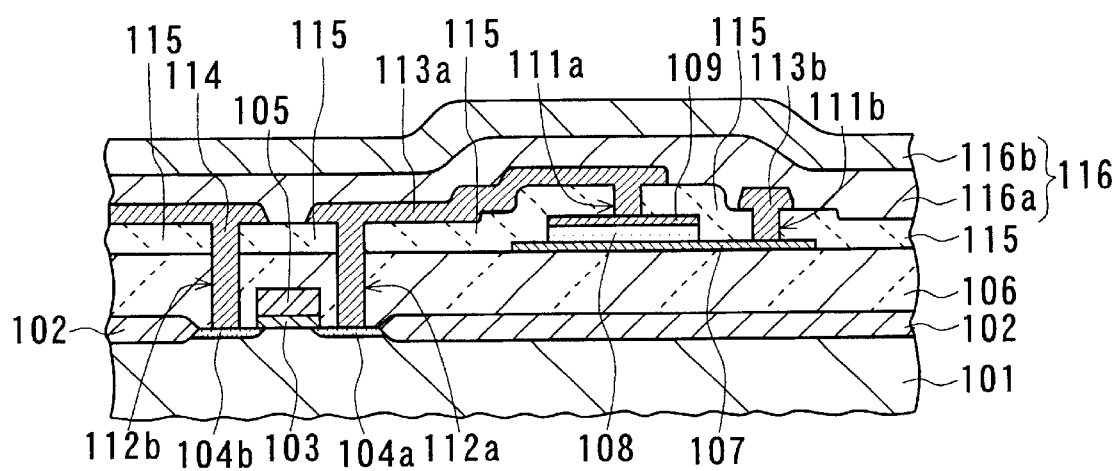
FIG. 1 is a partial, cross-sectional view of a memory cell of a conventional semiconductor memory device.
Figure 2:
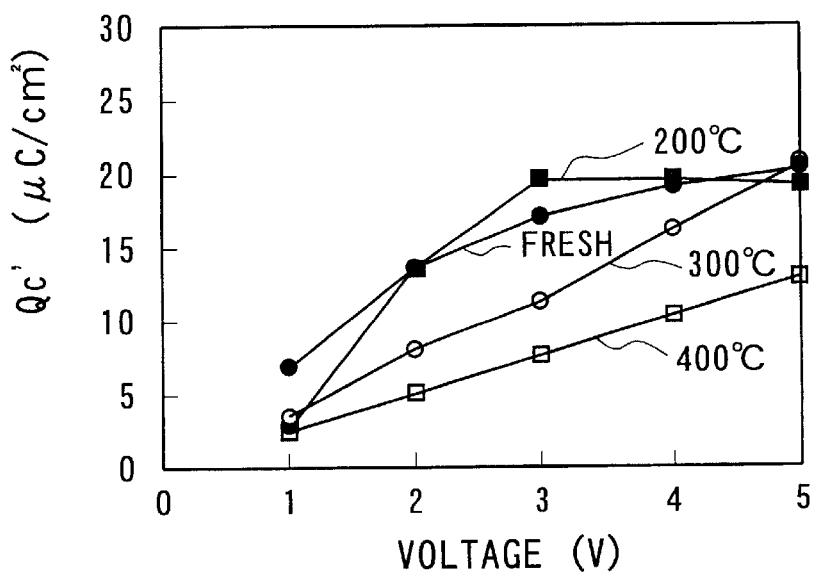
FIG. 2 is a graph showing the relationship of the polarization degradation $Q_c'$ of the PLZT film of the hydrogen-damaged conventional device shown in FIG. 1 with the bias voltage applied thereto while using the annealing temperature as a parameter.
Figure 3:
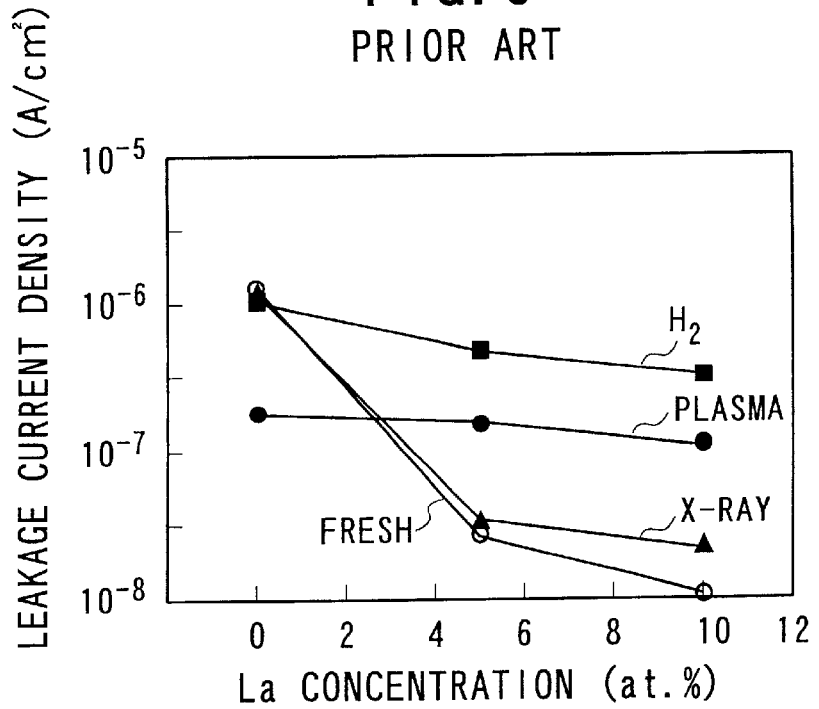
FIG. 3 is a graph showing the relationship of the leakage current density of the storage capacitor of the damaged conventional device shown in FIG. 1 with the lanthanum (La) concentration of the PLZT film.

Preferred embodiments of the present invention will be described in detail below while referring to the drawings attached.

First Embodiment

Figure 4:
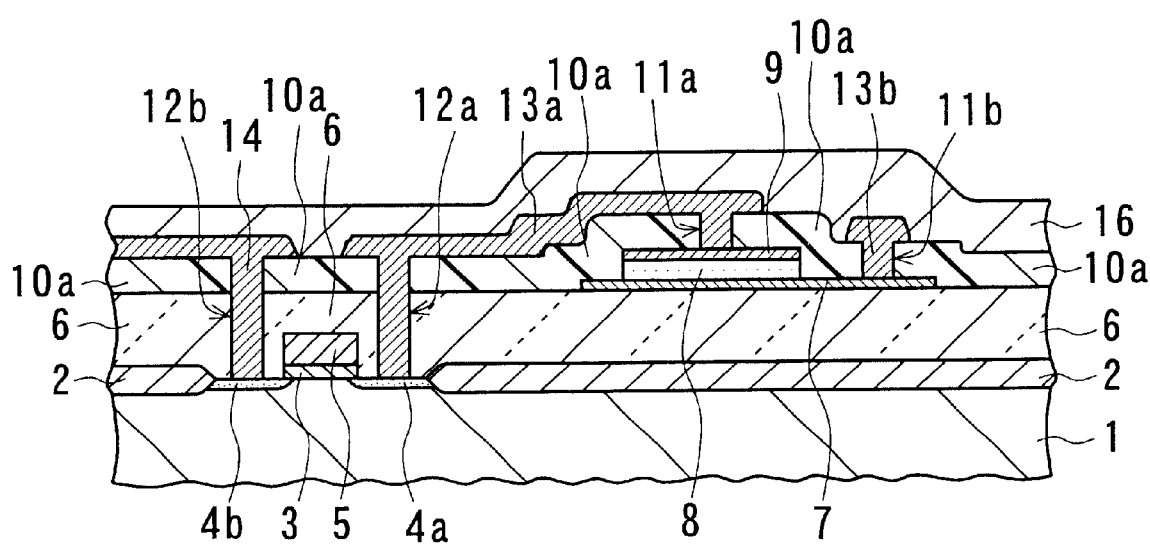
FIG. 4 is a partial, cross-sectional view of a memory cell of a semiconductor memory device fabricated by a method according to a first embodiment of the present invention.

FIG. 4 shows the configuration of a semiconductor memory device fabricated by a method according to a first embodiment of the present invention.

In FIG. 4, an isolation insulator 2 is formed on a single-crystal silicon substrate 1 to define an active region. In the active region, a source region 4a and a drain region 4b are formed in the substrate 1, and a gate electrode 5 is formed over the substrate 1 thorough a gate insulating film 3 between the source and drain regions 4a and 4b, thereby forming a MOSFET.

An interlayer insulating film 6 is formed to cover the MOSFET and the isolation insulator 2.

A lower electrode 7 of a storage capacitor is formed on the interlayer insulating film 6. A ferroelectric film 8 of the storage capacitor is formed on the lower electrode 7 to be partially overlapped therewith. An upper electrode 9 of the storage capacitor is formed on the ferroelectric film 8 to be entirely overlapped therewith.

A first protection film 10 made of silicon dioxide ($SiO_2$) is formed on the interlayer insulating film 6 to cover the storage capacitor and the MOSFET.

A patterned, metallic wiring film 13a is formed on the first protection film 10a to be electrically connected to the upper electrode 9 of the capacitor through a contact hole 11a and the source region 4a of the MOSFET through a contact hole 12a. The contact hole 11a penetrates the first protection film 10a alone. The contact hole 12a penetrates the first protection film 10a and the interlayer insulating film 6.

A patterned, metallic wiring film 13b is formed on the first protection film 10a to be electrically connected to the lower electrode 7 of the capacitor through a contact hole 11b. The contact hole 11b penetrates the first protection film 11a alone.

A patterned, metallic wiring film 14 is formed on the first protection film boa to be electrically connected to the drain region 4b of the MOSFET through a contact hole 12b. The contact hole 12b penetrates the first protection film 10a and the interlayer insulating film 6.

A second protection film 16 is formed on the first protection film 10a to cover the metallic wiring films 113a, 113b, and 114.

Next, a fabrication method of the semiconductor memory device shown in FIG. 4 having the above-described configuration is explained below with reference to FIGS. 10A to 10E.

First, the isolation insulator 2 is formed on the single-crystal silicon substrate 1 by the Local Oxidation of Silicon (LOCOS) method, thereby defining the active region.

Then, the source and drain regions 4a and 4b are formed in the active region of the substrate 1 by an ion-implantation process. The gate insulating film 3 is formed on the substrate 1 by a thermal oxidation process. The gate electrode 5 is formed by a patterned polysilicon film on the gate insulating film 3 between the source and drain regions 4a and 4b. Thus, the MOSFET is formed on the substrate 1, as shown in FIG. 10A.

Figure 10A:
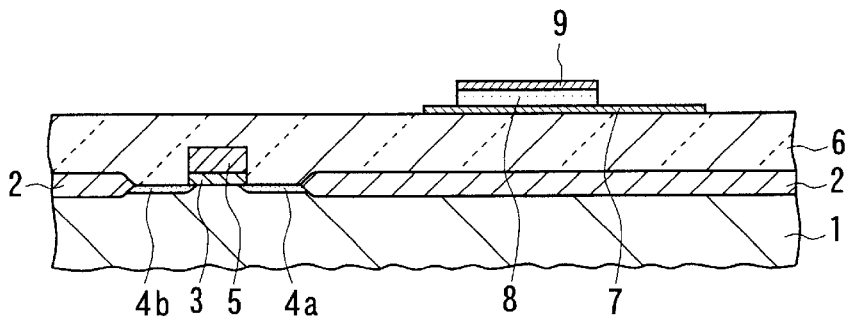
FIGS. 10A to 10F are partial, cross-sectional views showing the process steps of the fabrication method according to the first embodiment, respectively.

Following this, a $SiO_2$ film serving as the interlayer insulating film 6 is formed by a CVD process to cover the MOSPET and the isolation insulator 2, as shown in FIG. 10A.

Subsequently, the lower electrode 7 of the storage capacitor is formed on the interlayer insulating film 6. The lower electrode 7 has a two-layer structure formed by a lower titanium (Ti) subfilm with a thickness of 20 nm and an upper platinum (Pt) subfilm with a thickness of 200 nm. The lower Ti subfilm is used to ensure a satisfactorily adhesion strength to the interlayer insulating film 6 of $SiO_2$.

A $SrBi_2Ta_2O_9$ (SBT) film with a thickness of 180 nm, which serves as the ferroelectric film 8 of the storage capacitor, is formed on the lower electrode 7 to be partially overlapped therewith. The $SrBi_2Ta_2O_9$ film 8 is formed by a coating and sintering process, in which a solution of a specific organic metal contained in an organic solvent is coated on the interlayer insulating film 6 to thereby form an organic solution film, and then, the organic solution film is dried and sintered. The coating, drying, and sintering steps are repeated as necessary.

The $SrBi_2Ta_2O_9$ film 8 may be formed by sputtering or CVD process. In the case of sputtering or CVD process, to give a satisfactorily good film quality for the storage capacitor, the $SrBi_2Ta_2O_9$ film 8 is additionally subjected to a proper heat-treatment process after the film formation process.

Following this, the upper electrode 9 of the storage capacitor is formed on the ferroelectric film 8 to be entirely overlapped therewith. The upper electrode 8 has a single-layer structure formed by a platinum (Pt) film with a thickness of 200 nm.

Each of the upper and lower electrodes 9 and 7 may be made of a low-reactive metal such as platinum and gold (Au) or a conductive oxide of metal such as ruthenium (Ru).

Figure 10B:
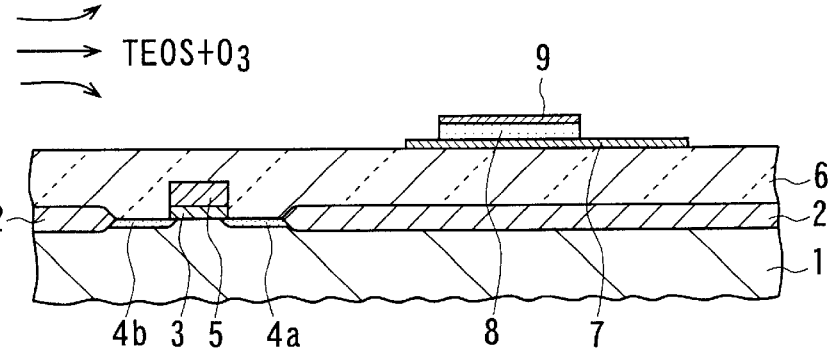
Figure 10C:
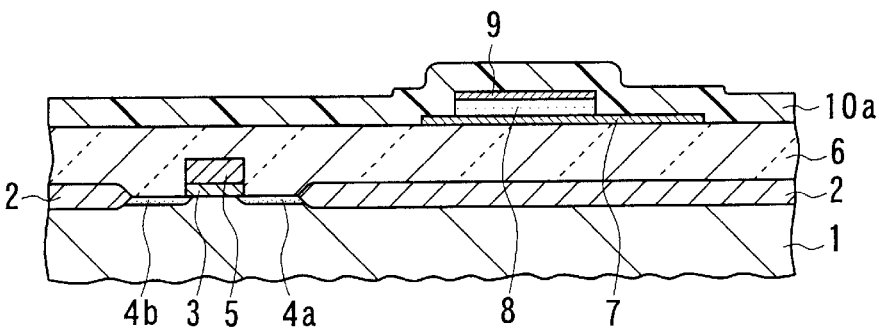

The first protection film 10a, which is made of $SiO_2$, is formed on the interlayer insulating film 6 to cover the storage capacitor and the MOSFET by a thermal CVD process, as shown in FIGS. 10B and 10C. The film 10a has a thickness of approximately 400 nm.

This thermal CVD process is performed under the following conditions:
(i) The ambient pressure is set to be equal to the atmospheric pressure or lower (for example, several mTorr to several Torr).
(ii) The gaseous source of silicon is tetraethyl orthosilicate or tetraethoxysilane (TEOS) $[Si(OC_2H_5)_4]$
(iii) The substrate temperature is set as 375° C.
(iv) Ozone ($O_3$) is additionally used as an oxidizing agent for TEOS.

TEOS contains no hydrogen atom which is chemically bonded to the silicon atoms directly, ozone has a strong oxidizing action, and the substrate temperature is as low as 375° C. Therefore, the TEOS generates no gaseous hydrogen through decomposition of the TEOS. Even if hydrogen is generated due to some reason, the hydrogen will not be activated because of the low temperature of 375° C.

Also, because no plasma is utilized, it is needless to say that even if hydrogen (H or $H_2$) or a hydrogen composition is generated, no activation of the hydrogen and hydrogen compositions takes place due to plasma.

As a result, the polarization of the ferroelectric film 8 is prevented from degrading and at the same time, the leakage current of the storage capacitor is prevented from increasing, thereby suppressing the dielectric resistance degradation.

The decomposition or oxidation reaction of the TEOS for depositing the $SiO_2$ film is expressed by the following chemical equation (1). It is seen from this equation (1) that no hydrogen is generated during the CVD process.

$$Si(OC_2H_5)_4 + 8O_3 \rightarrow SiO_2 + 8CO_2 + 10\ H_2O \quad (1)$$

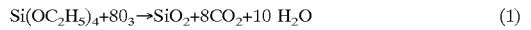

It is preferred that the substrate temperature is set as a value in the range of 300 to 500° C. When the substrate temperature is lower than 300° C., the $SiO_2$ film tends to contain a large amount of water. When the substrate temperature is higher than 500° C., the deposition or growth rate of the $SiO_2$ film is excessively low and the step coverage tends to degrade. Also, the $SiO_2$ film has a good quality in this range.

It is more preferred that the substrate temperature is set as a value in the range of 350 to 400° C. When the substrate temperature is set in this range, the $SiO_2$ film having a good quality is deposited at a high deposition rate.

The state at this stage is shown in FIG. 10c.

Figure 10D:
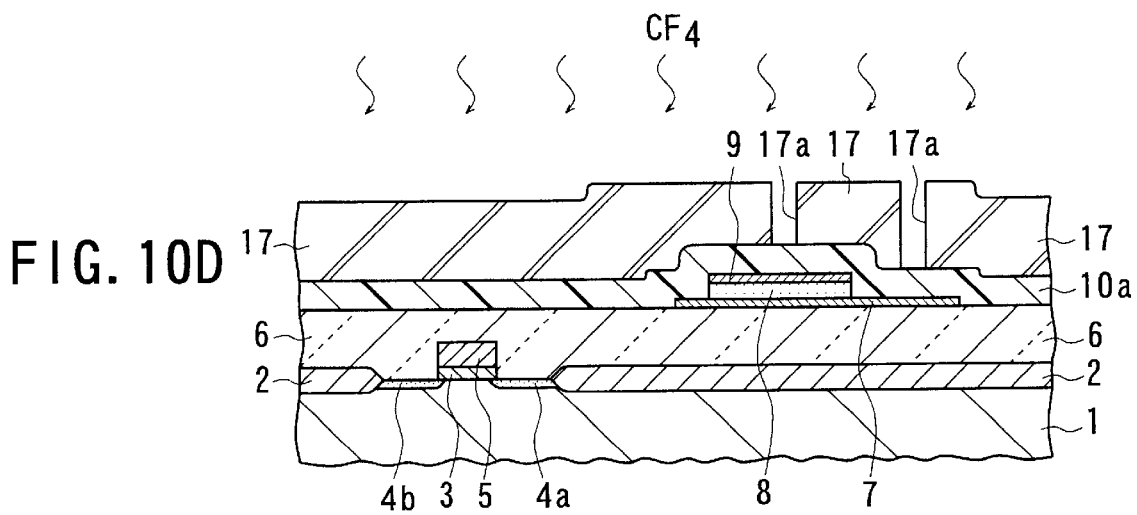

Following the thermal CVD process of depositing the interlayer insulating film 10a, a patterned photoresist film 17 is formed on the interlayer insulating film 10a. The photoresist film 17 has windows 17a at the locations corresponding to the contact holes 11a and 11b, as shown in FIG. 10D.

Figure 10E:
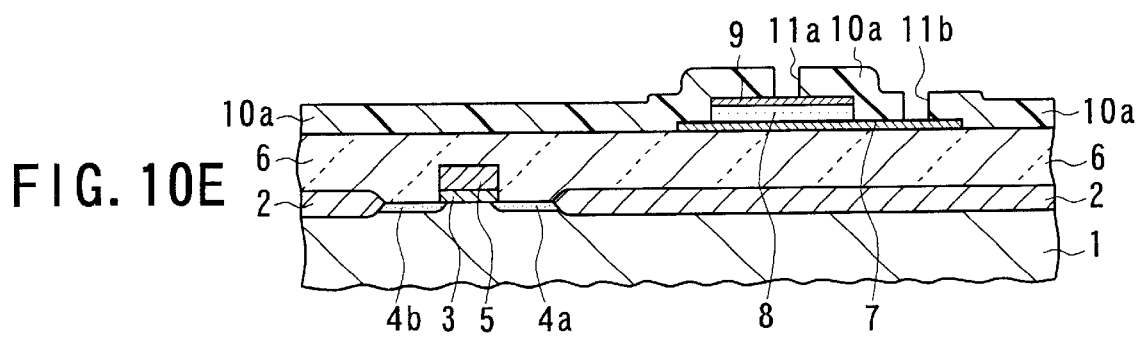
Figure 10F:
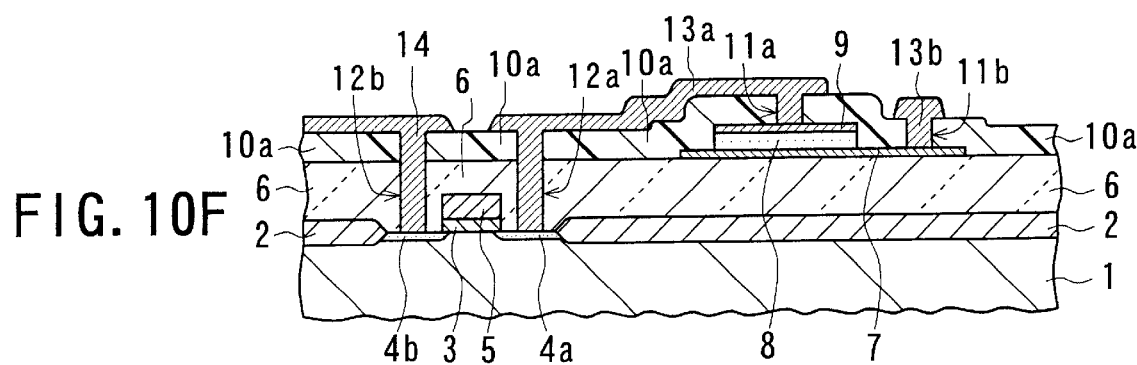

Using the patterned photoresist film 17 as a mask, the interlayer insulating film 10a of $SiO_2$ is selectively etched by a reactive ion etching (RIE) process while $CF_4$ is used as an etching gas, thereby forming the contact holes 11a and 11b penetrating the $SiO_2$ film 10a, The state at this stage is shown in FIG. 10E.

$C_2F_6$ may be used instead of $CF_4$. Oxygen gas may be added to the $CF_4$ gas.

Because the etching gas contains no hydrogen in this process, hydrogen is not generated even if the etching gas is decomposed due to plasma. As a result, the ferroelectric film is not damaged due to the existence of hydrogen.

Moreover, the contact holes 12a and 12b are formed to extend the source and drain regions 4a and 4b by known processes, respectively. The first to third wiring films 13a, 13*b*, and 14 are formed on the SiO₂ film 10*a* by known processes. Finally, the second protection film 16 is formed to cover the wiring films 13*a*, 13*b*, and 14 by a known process.

Thus, the semiconductor memory device shown in FIG. 4 is finished.

With the method of fabricating a semiconductor device according to the first embodiment, as described above, the SiO₂ film 10*a* is formed to cover the capacitor by a thermal CVD process in an atmosphere containing no plasma at a substrate temperature of 375° C. in which hydrogen is prevented from being activated due to heat. TEOS, which is the source material of the SiO₂ film 10*a*, has a property that no hydrogen is generated in the atmosphere through decomposition of the TEOS during the thermal CVD process.

As a result, the ferroelectric film 8 is not reduced by the activated hydrogen existing in the atmosphere during the thermal CVD process. Thus, the leakage current is prevented from increasing and the dielectric breakdown resistance is prevented from decreasing during the CVD process for forming the SiO₂ film 10*a* to cover the capacitor. This means that the performance degradation of the capacitor is prevented from occurring.

Moreover, since the dielectric film of the capacitor is made of ferroelectric SBT, the polarization of the ferroelectric capacitor is prevented from degrading. This is also because the ferroelectric film 8 is not reduced by the activated hydrogen existing in the atmosphere during the thermal CVD process.

Second Embodiment

A method of fabricating a semiconductor device according to a second embodiment the present invention is shown in FIGS. 11A to 11E.

The MOSFET and the storage capacitor having the same configuration as those in the first embodiment are fabricated in the same way as the first embodiment.

Figure 11A:
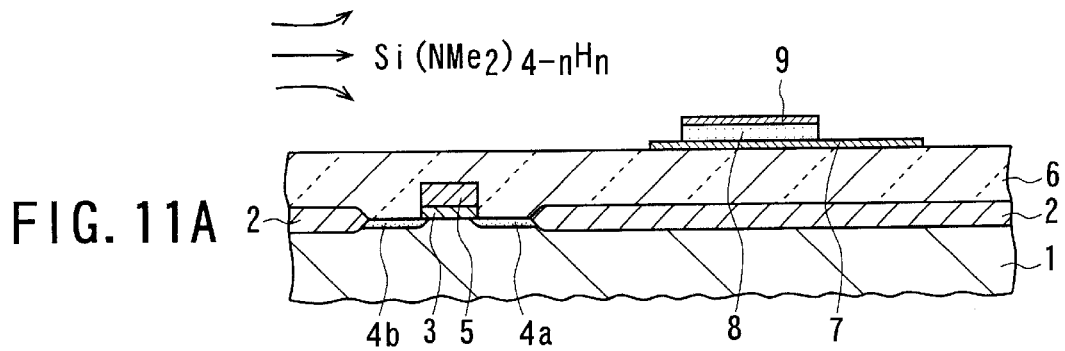
FIGS. 11A to 11E are partial, cross-sectional views showing the process steps of a fabrication method according to a second embodiment, respectively.
Figure 11B:
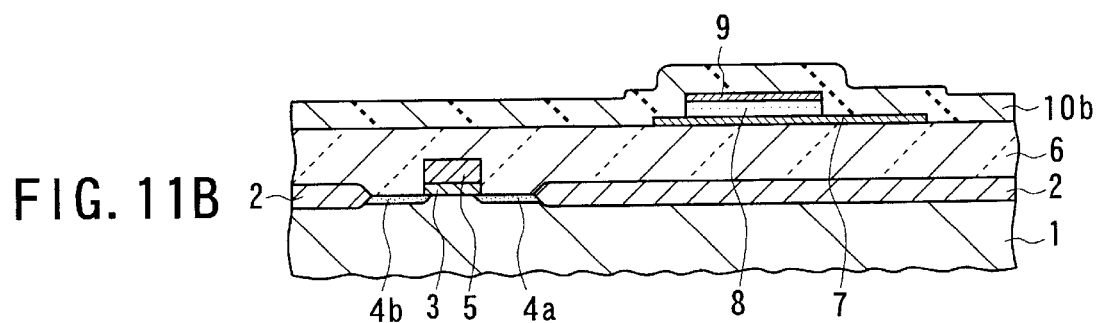

Next, instead of the first protection film 10*a* made of SiO₂, a first protection film 10*b* made of silicon nitride (Si₃N₄) is formed on the interlayer insulating film 6 to cover the storage capacitor and the MOSFET by a thermal CVD process, as shown in FIGS. 11A and 11B. The film 10*b* has a thickness of approximately 400 nm.

This thermal CVD process is performed under the following conditions:

(i) The ambient pressure is set to be equal to the atmospheric pressure or lower (for example, several mTorr to several Torr).

(ii) The gaseous source of silicon is a silicon diamide complex [Si(NMe₂)₄₋ₙHₙ], where n is zero or a natural number.

(iii) The substrate temperature is set as 600° C. [Si(NMe₂)₄₋ₙHₙ] contains no hydrogen atom which is chemically bonded to the silicon atoms directly, and the substrate temperature is as low as 600° C. Therefore, the [Si(NMe₂)₄₋ₙHₙ] generates no gaseous hydrogen nor hydrogen composition through decomposition of the [Si(NMe₂)₄₋ₙHₙ].

Also, because no plasma is utilized, it is needless to say that no activation of hydrogen takes place due to plasma even if hydrogen is generated.

As a result, the polarization of the ferroelectric film 8 is prevented from degrading and at the same time, the leakage current of the storage capacitor is prevented from increasing, thereby suppressing the dielectric resistance degradation.

The decomposition or oxidation reaction of the [Si(NMe₂)₄₋ₙHₙ] for depositing the Si₃N₄ film is expressed by the following chemical equation (2). It is seen from this equation (1) that no hydrogen is generated during the CVD process, where n=0.

$$3Si(NMe_2)_4 + 4NH_3 \rightarrow Si_3N_4 + 12HNMe_2 \qquad (2)$$

It is preferred that the substrate temperature is set as a value in the range of 500 to 750° C. When the substrate temperature is lower than 500° C, the quality of the Si₃N₄ film tends to degrade. When the substrate temperature is higher than 750° C., the deposition or growth rate of the Si₃N₄ film is excessively low.

An ammonia (NH₃) gas may be added to the [Si(NMe₂)₄₋ₙHₙ]. [MeSiHNHₙ] may be used instead of [Si(NMe₂)₄₋ₙHₙ].

The state at this stage is shown in FIG. 11B.

Figure 11C:
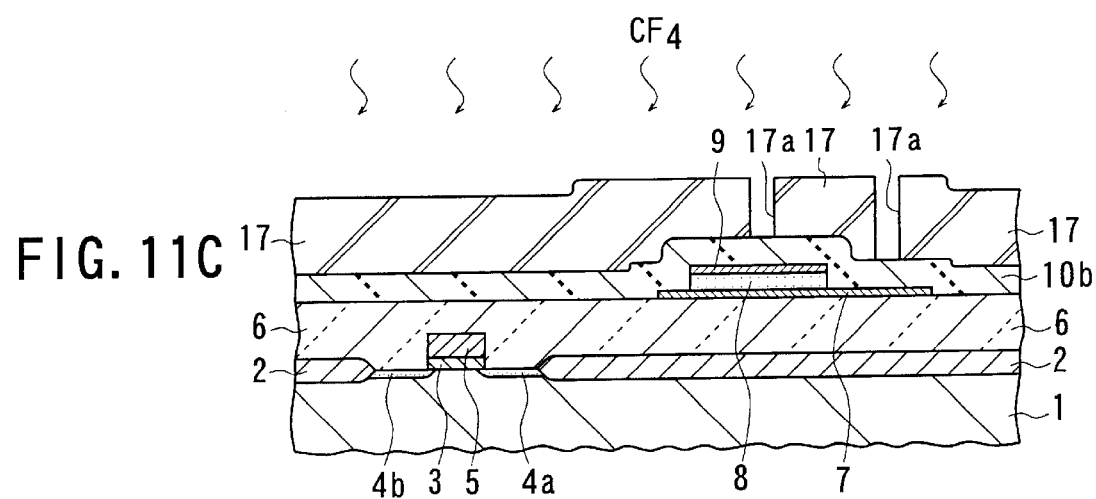

Following the thermal CVD process of depositing the interlayer insulating film 10*b*, a patterned photoresist film 17 is formed on the interlayer insulating film 10*b*. The photoresist film 17 has windows 17*a* at the locations corresponding to the contact holes 11*a* and 11*b*, as shown in FIG. 11C.

Figure 11D:
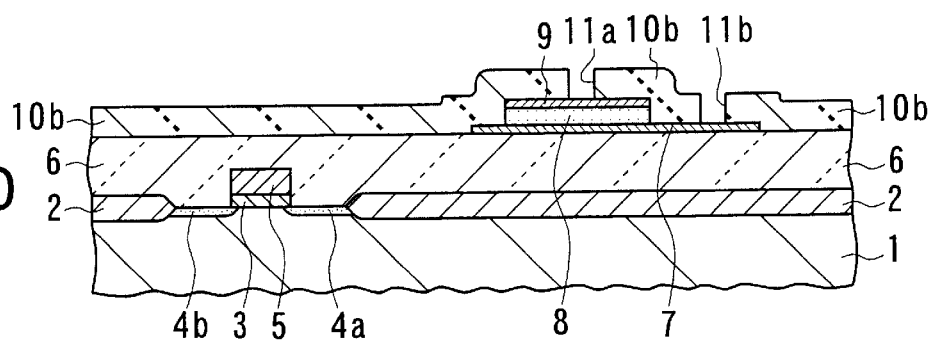
Figure 11E:
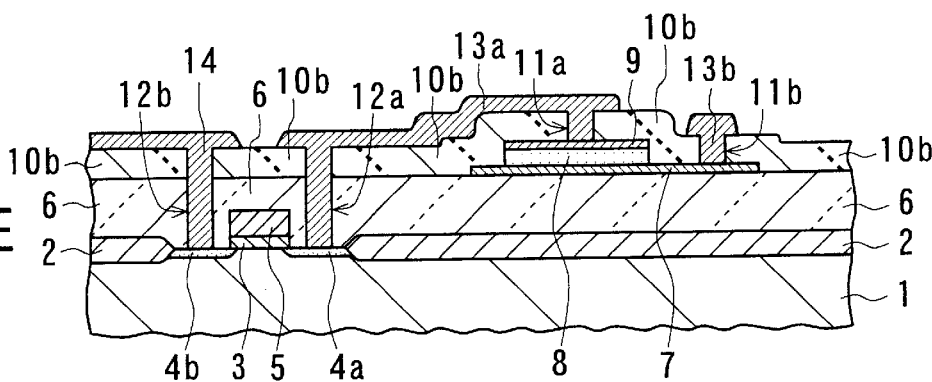

Using the patterned photoresist film 17 as a mask, the interlayer insulating film 10*b* of Si₃N₄ is selectively etched by an RIE process while CF₄ is used as an etching gas, thereby forming the contact holes 11*a* and 11*b* penetrating the Si₃N₄ film 10*b*. The state at this stage is shown in FIG. 11D.

SiF₄ may be used instead of CF₄. Oxygen gas may be added to the CF₄ gas. Oxygen and nitrogen gases may be added to the CF₄ gas. The combination of NF₃ and Cl₂ gasses may be used instead of the CF₄ gas.

Because the etching gas contains no hydrogen in this process, hydrogen is not generated. As a result, the ferroelectric film 8 is not damaged due to the existence of hydrogen.

Moreover, the contact holes 12*a* and 12*b* are formed to extend the source and drain regions 4*a* and 4*b* by known processes, respectively. The first to third wiring films 13*a*, 13*b*, and 14 are formed on the Si₃N₄ film 10*b* by known processes. Finally, the second protection film 16 is formed to cover the wiring films 13*a*. 13*b*, and 14 by a known process.

Thus, the semiconductor memory device having the same configuration as shown in FIG. 4 except that the SiO₂ film 10*a* is replaced with the Si₃N₄ film 10*b* is finished.

With the method of fabricating a semiconductor device according to the second embodiment, the Si₃N₄ film 10*b* is used instead of the SiO₂ film 10*a*, where the Si₃N₄ film 10*b* is, higher in density and chemical stability than the SiO₂ film 10*a*. Also, the Si₃N₄ film 10*b* has an property that hydrogen gas is difficult to penetrate and therefore, the Si₃N₄ film 10*b* may serve as a barrier against hydrogen gas that will be generated in the subsequent processes.

As a result, the effect of hydrogen to the ferroelectric film 8 is effectively decreased by the Si₃N₄ film 10*b*.

Third Embodiment

Figure 12A:
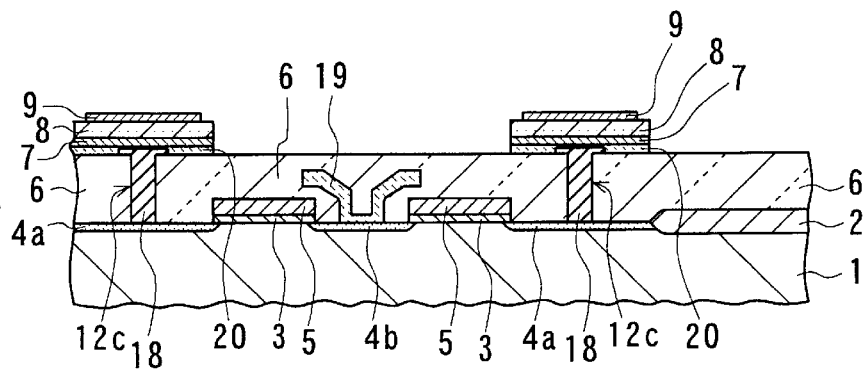
FIGS. 12A to 12O are partial, cross-sectional views showing the process steps of a fabrication method according to a third embodiment, respectively.
Figure 12B:
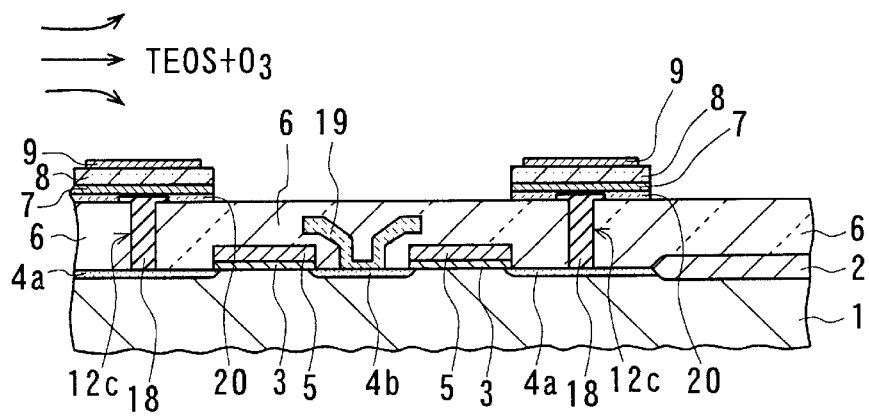
Figure 12C:
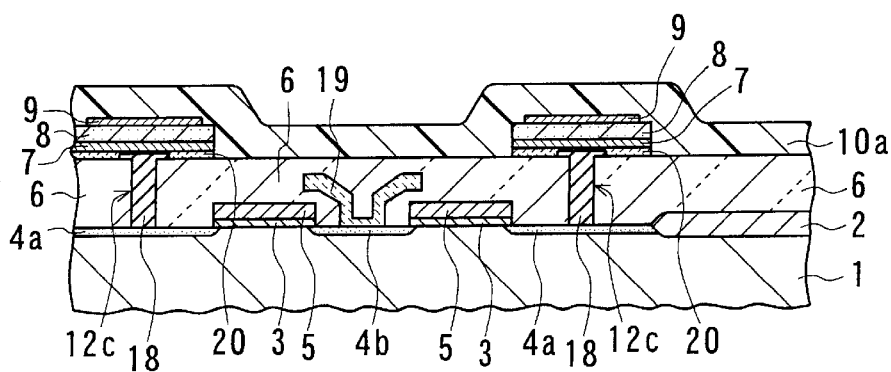
Figure 12G:
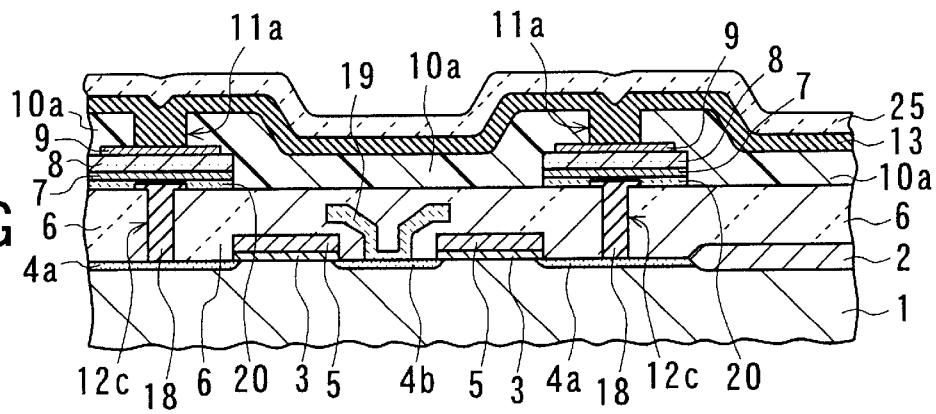
Figure 12H:
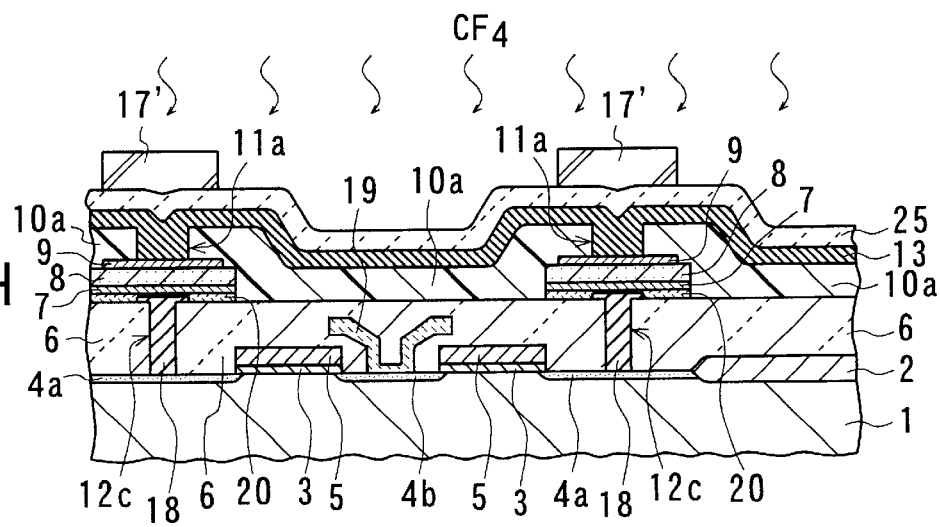
Figure 12I:
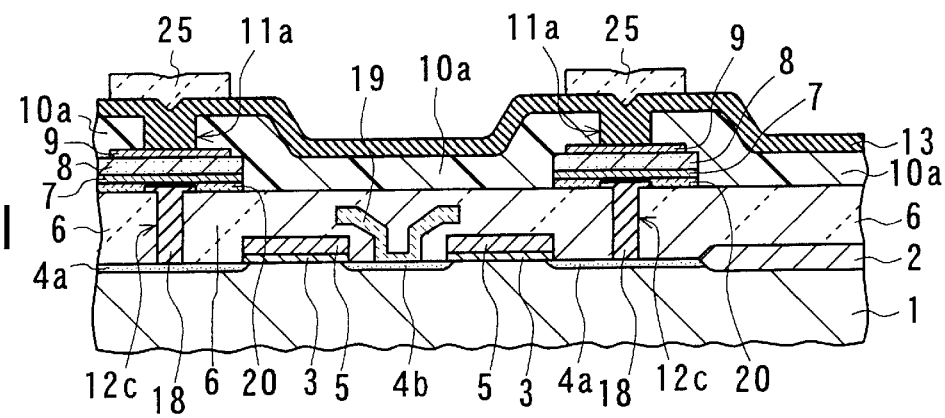
Figure 12J:
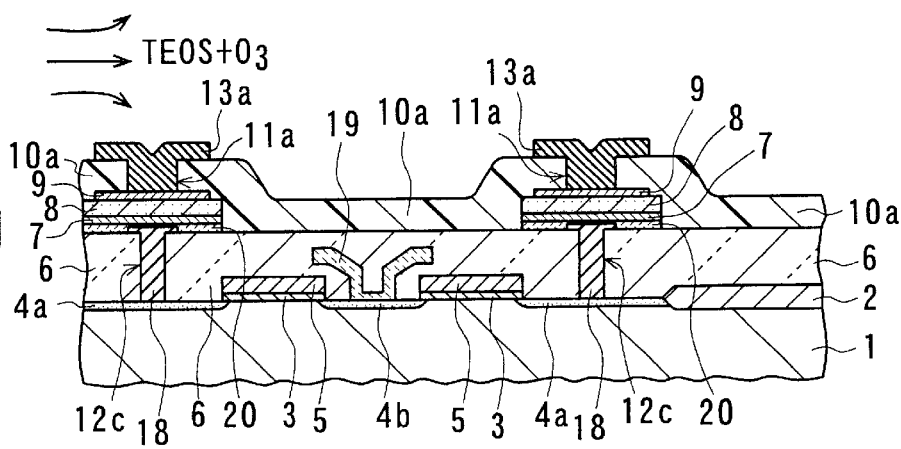
Figure 12K:
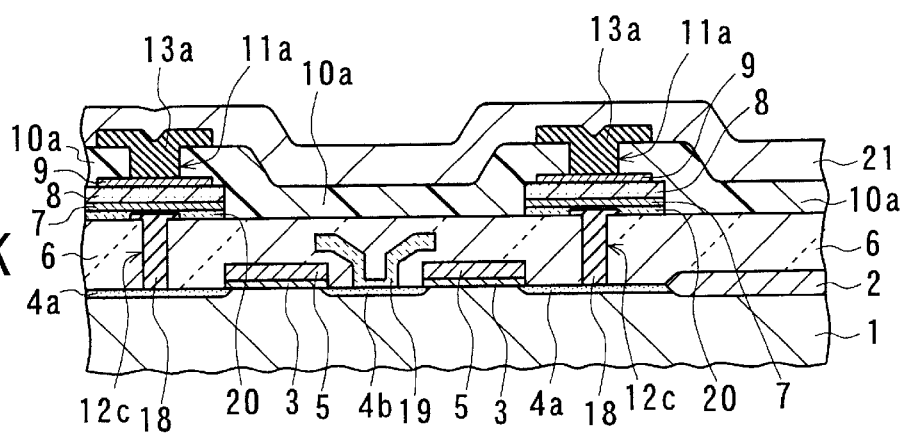
Figure 12L:
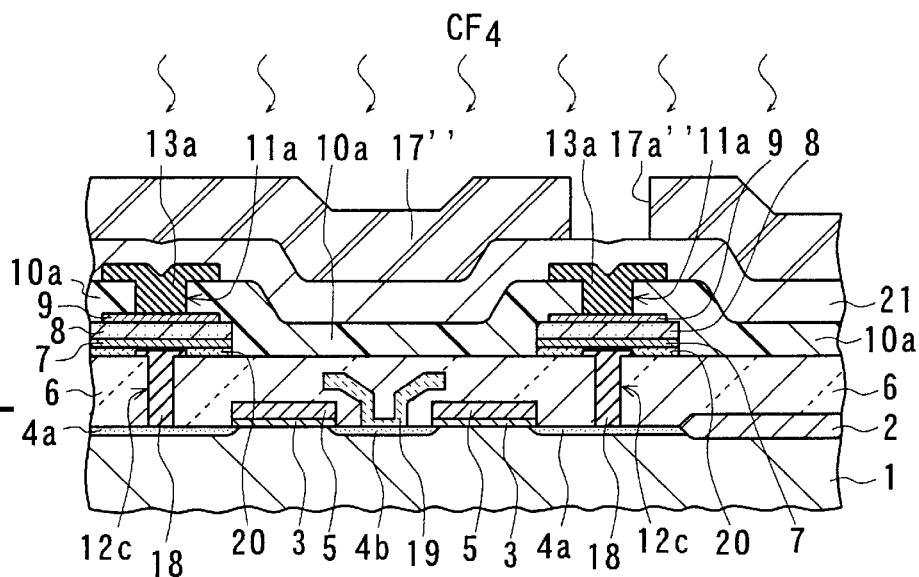
Figure 12M:
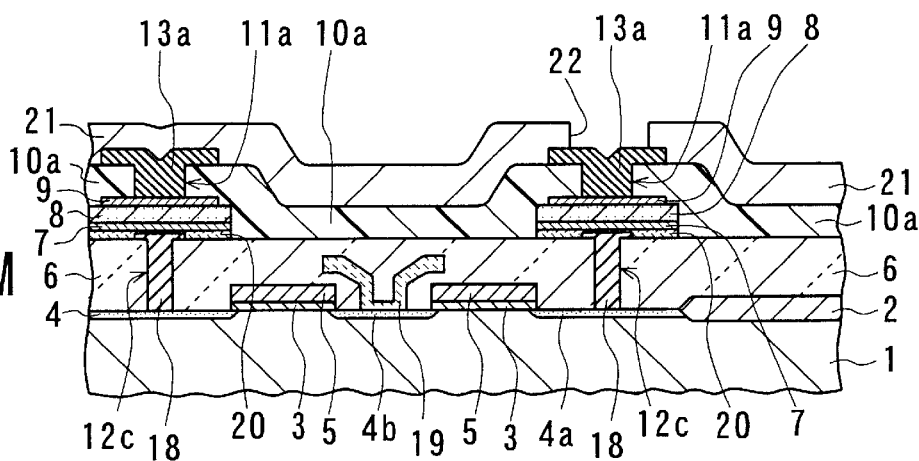
Figure 12N:
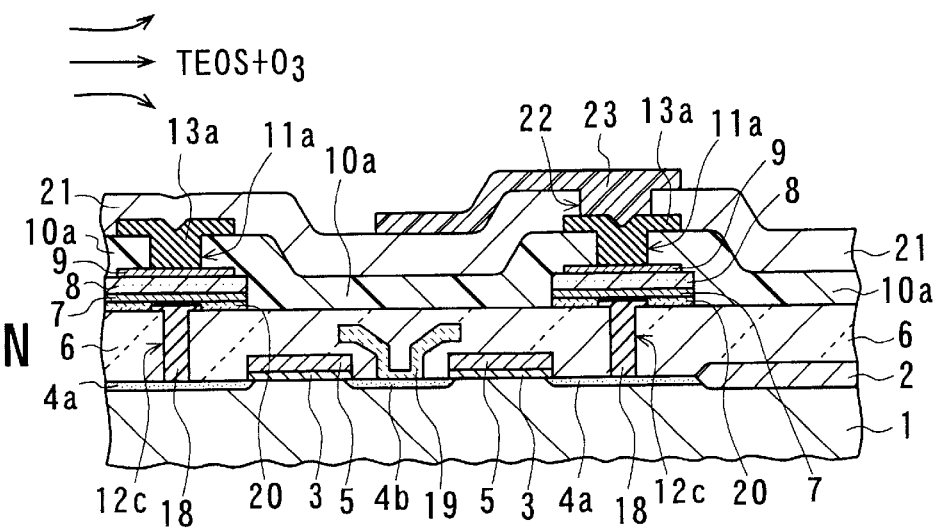
Figure 12O:
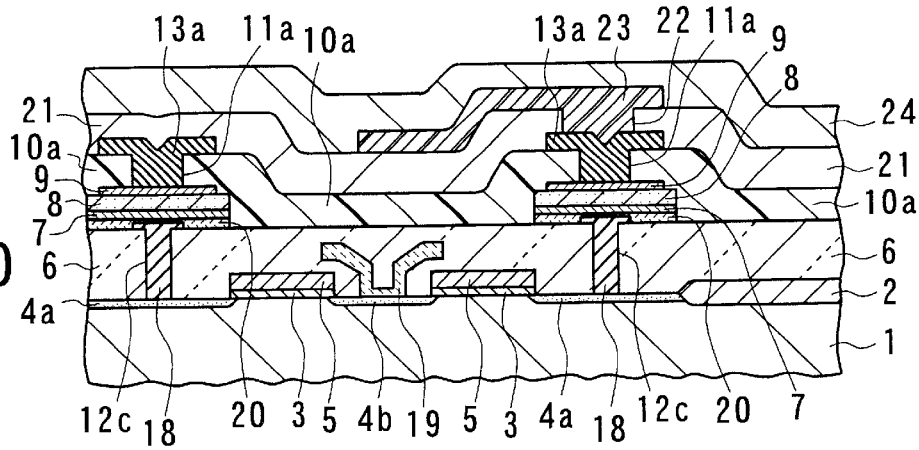

A method of fabricating a semiconductor device according to a third embodiment is shown in FIGS. 12A to 12O.

In FIG. 12A, an isolation insulator 2 is formed on a single-crystal silicon substrate 1 to define an active region. In the active region, two source regions 4*a* and a common drain region 4*b* are formed in the substrate 1, and gate electrodes 5 are formed over the substrate 1 thorough corresponding gate insulating films 3, thereby forming a first MOSFET located at the right-hand side and a second MOSFET located at the left-hand side.

A patterned wiring film 19, which serves as a bit line also, is formed to be contacted with and connected to the common drain region 4b. The wiring film 19 constitute a first-level wiring film An interlayer insulating film 6 is formed to cover the first and second MOSFETs, the isolation insulator 2, and the patterned wiring film or bit line 19. The interlayer insulating film 6 has contact holes 12c located over the source regions 12c. Two polysilicon plugs 18 are buried in the contact holes 12c to be contacted with the corresponding source regions 4a. The tops of the plugs 18 protrude slightly from the interlayer insulating film 6.

Two metal films 20 of the first and second storage capacitors are formed on the interlayer insulating film 6 to surround the tops of the plugs 18, which are provided for preventing the dopant contained in the polysilicon plugs 18 from diffusing to the outside.

Two lower electrodes 7 of the first and second storage capacitors are formed on the interlayer insulating film 6 to cover the corresponding metal films 20 and to be overlapped, with the corresponding source regions 4a. Two ferroelectric films 8 of the first and second storage capacitors are formed on the corresponding lower electrodes 7 to be entirely overlapped therewith. Two upper electrodes 9 of the first and second storage capacitors are formed on the corresponding ferroelectrlc films 8 to be approximately entirely overlapped therewith.

The lower electrodes 7 are connected to the corresponding source regions 4a through the corresponding polysilicon plugs 18.

The state at this stage is shown in FIG. 12A.

Next, as shown in FIGS. 12B and 12C, a first protection film 10a made of $SiO_2$ is formed on the interlayer insulating film 6 to cover the first and second storage capacitors and the first and second MOSFETS by a thermal CVD process in the same way as the first embodiment.

If a $Si_3N_4$ film 10b is provided instead of the $SiO_2$ film 10a, the film 10b may be formed by a thermal CVD process in the same way as the second embodiment.

Following the thermal CVD process of depositing the interlayer insulating film 10a, a patterned photoresist film 17 is formed on the interlayer insulating film 10a. The photoresist film 17 has windows 17a at the locations corresponding to the contact holes 11a and 11b, as shown in FIG. 12D.

Using the patterned photoresist film 17 as a mask, the interlayer insulating film 10a of $SiO_2$ is selectively etched by an RIE process while $CF_4$ is used as an etching gas, thereby forming the contact holes 11a and 11b penetrating the $SiO_2$ film 10a. The state at this stage is shown in FIG. 12E.

Because the etching gas contains no hydrogen in this process, hydrogen is not generated even if the etching gas is decomposed due to plasma, As a result, the ferroelectric film 8 is not damaged due to the existence of hydrogen.

If a $Si_3N_4$ film 10b is provided instead of the $SiO_2$ film 10a, the film 10b may be selectively etched in the same way as the second embodiment.

A wiring metal film 13 having four-layer structure is formed on the $SiO_2$ film 10a by a sputtering process, as shown in FIG. 12F. Here, the wiring metal film 13 is formed by titanium nitride (TIN), aluminum (Al), TiN, and Ti subfilms. The wiring metal film 13 is contacted with and electrically connected to the upper electrodes of the first and second storage capacitors through the corresponding contact holes 11a penetrating the $SiO_2$ film 10a.

Further, as shown in FIG. 12G, a hard masking film 25, which is made of a proper insulating film, is formed on the wiring metal film 13. A patterned photoresist film 17' is then formed on the hard masking film 25 to selectively cover the first and second storage capacitors, as shown in FIG. 12H. Using the patterned photoresist film 17' as a mask, the hard masking film 25 is selectively etched by an RIE process using $CF_4$ as an etching gas, as shown in FIG. 12I.

Using the hard masking film 25 thus patterned as a mask, the wiring metal film 13 is selectively etched to thereby form a second-level wiring film 13a, as shown in FIG. 12J.

The patterned photoresist film 17' may be formed directly on the wiring metal film 13 without using the hard masking film 25.

Next, as shown in FIGS. 12J and 12K, a second protection film 21 made of $SiO_2$ is formed on the first protection film 10a of $SiO_2$ by a thermal CVD process in the same way as the first embodiment.

If a $Si_3N_4$ film is provided instead of the $SiO_2$ film 21, the $Si_3N_4$ film may be formed by a thermal CVD process in the same way as the second embodiment.

Following the thermal CVD process of depositing the second protection film 21, a patterned photoresist film 17" is formed on the film 21, as shown in FIG. 12L.

Using the patterned photoresist film 17" as a mask, the second protection film 21 made of $SiO_2$ is selectively etched by an RIE process while $CF_4$ is used as an etching gas, thereby forming a contact hole 22 penetrating through the $SiO_2$ film 21. The state at this stage is shown in FIG. 12M.

Because the etching gas contains no hydrogen in this process, hydrogen is not generated even if the etching gas is decomposed due to plasma. As a result, the ferroelectric film 8 is not damaged due to the existence of hydrogen.

If a $Si_3N_4$ film is provided instead of the $SiO_2$ film 21, the $Si_3N_4$ film may be selectively etched in the same way as the second embodiment.

Following this, a third-level wiring film 23 is formed on the second protection film 21 using a similar hard masking film described above. A photoresist film may be used alone or together with the hard masking film.

A passivation film 24 made of $SiO_2$ is formed on the $SiO_2$ film 21 to cover the third-level wiring film 23 by a thermal CVD process in the same way as the first embodiment, as shown in FIGS. 12N and 12O.

If a $Si_3N_4$ film is provided instead of the $SiO_2$ film 24, the $Si_3N_4$ film may be formed by a thermal CVD process in the same way as the second embodiment.

Thus, the semiconductor memory device according to the third embodiment is finished.

If a fourth wiring level and higher is/are necessary for forming a multi-level wiring structure, they may be formed by repeating the same processes as those in the first or second embodiment.

TESTS

The inventors conducted the following tests to confirm the advantages of the method according to the present invention. The result of the tests is shown in FIGS. 5 to 9.

Figure 5:
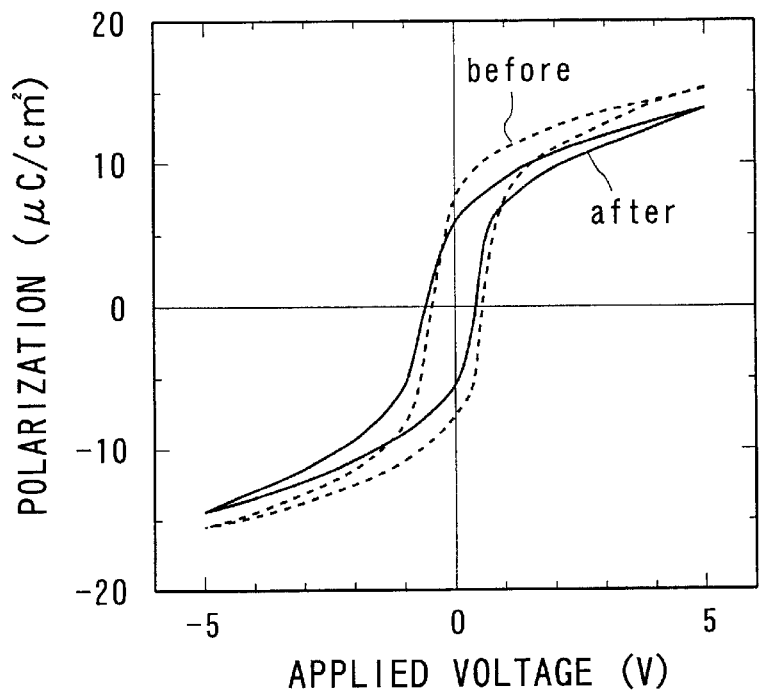
FIG. 5 is a graph showing the polarization characteristic of the ferroelectric film in the semiconductor memory device fabricated by using a conventional sputtering method.
Figure 6:
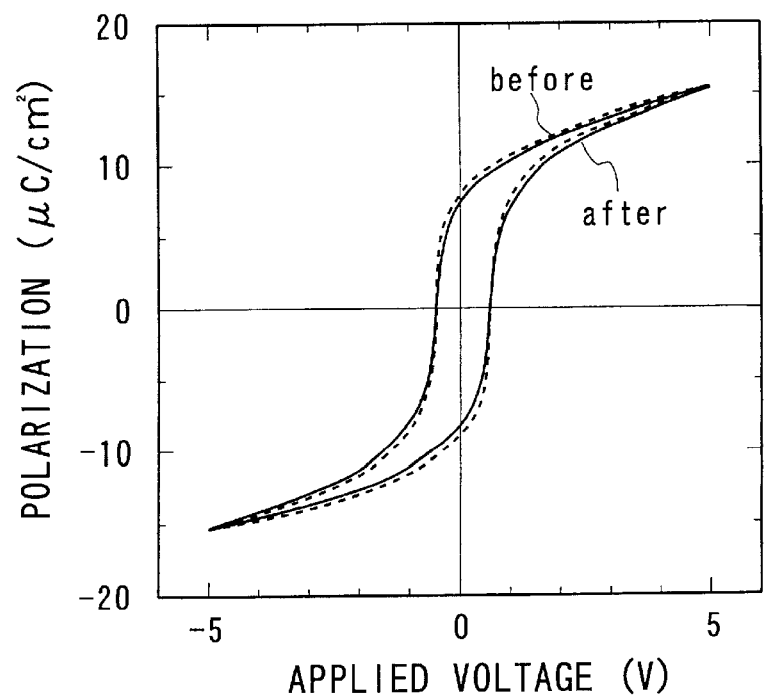
FIG. 6 is a graph showing the polarization characteristic of the ferroelectric film in the semiconductor memory device fabricated by the method according to the first embodiment.

FIGS. 5 and 6 show the polarization characteristic of the ferroelectric film 8 in the semiconductor memory devices fabricated by the conventional method and the method according to the first embodiment, respectively.

In FIGS. 5 and 6, the solid line denotes the hysteresis curve after the formation of the $SiO_2$ film 16, and the broken line denotes the hysteresis curve before the formation of the $SiO_2$ film 16. In FIG. 5, the hysteresis curve was given by using a conventional sputtering process. In FIG. 6, unlike the first embodiment, the contact holes 11a and 11b were formed by a wet etching process in order to avoid the effect of plasma during the etching process of forming the holes 11a and 11b.

It is seen from FIG. 5 that the polarization clearly degrades by approximately 34% due to the formation process of the $SiO_2$ film 16 in the conventional sputtering method. On the other hand, it is seen from FIG. 6 that substantially no degradation (at most approximately 10%) occurs in the polarization even after the formation process of the $SiO_2$ film 16. Thus, the polarization characteristic of the ferroelectric film 8 is effectively suppressed.

Figure 7:
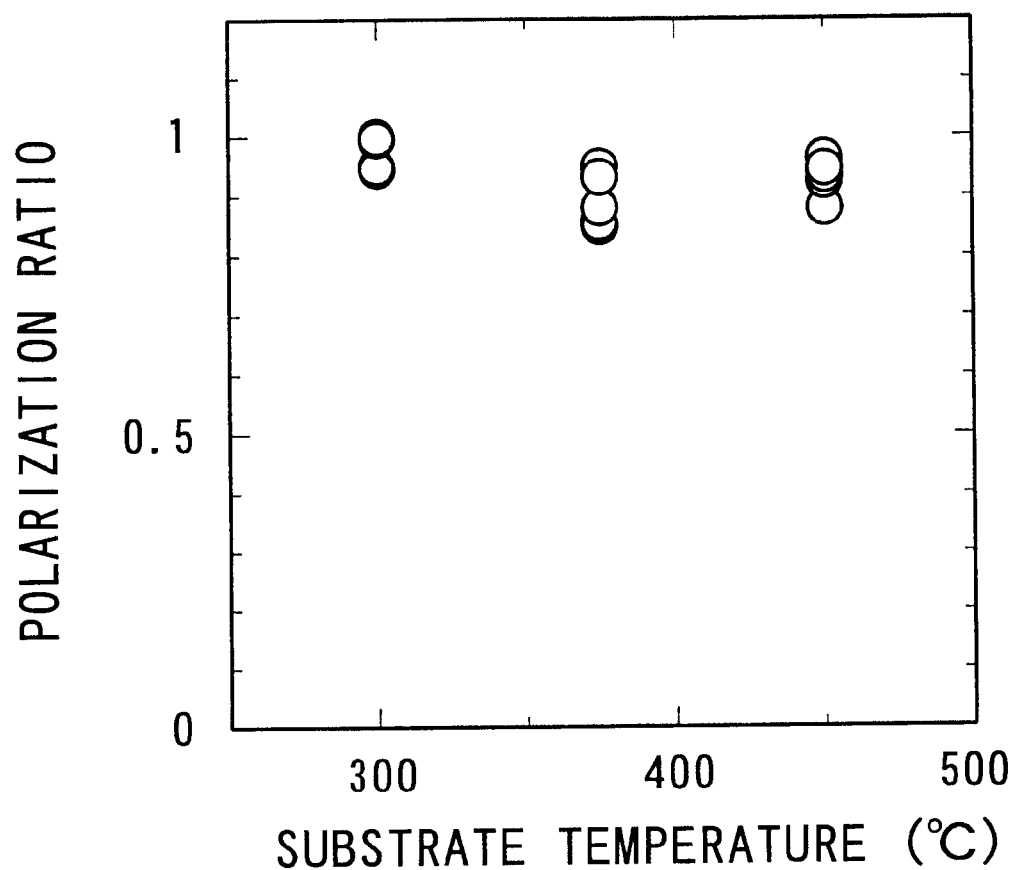
FIG. 7 is a graph showing the relationship between the polarization ratio of the ferroelectric film and the temperature of the semiconductor substrate in the semiconductor memory device fabricated by the method according to the first embodiment.

FIG. 7 shows the relationship between the polarization ratio of the ferroelectric film a and the temperature of the semiconductor substrate 1 in the semiconductor memory device fabricated by the method according to the first embodiment. In FIG. 7, the "polarization ratio" means a ratio of the polarization value after the formation of the $SiO_2$ film 16 with respect to that before the formation of the $SiO_2$ film 16. Therefore, if no degradation occurs in the polarization, the value of the residual polarization ratio will be equal to unity (1).

It is seen from FIG. 7 that substantially no degradation in the polarization is observed even if the temperature of the substrate 1 changes from 300 to 450° C.

Figure 8:
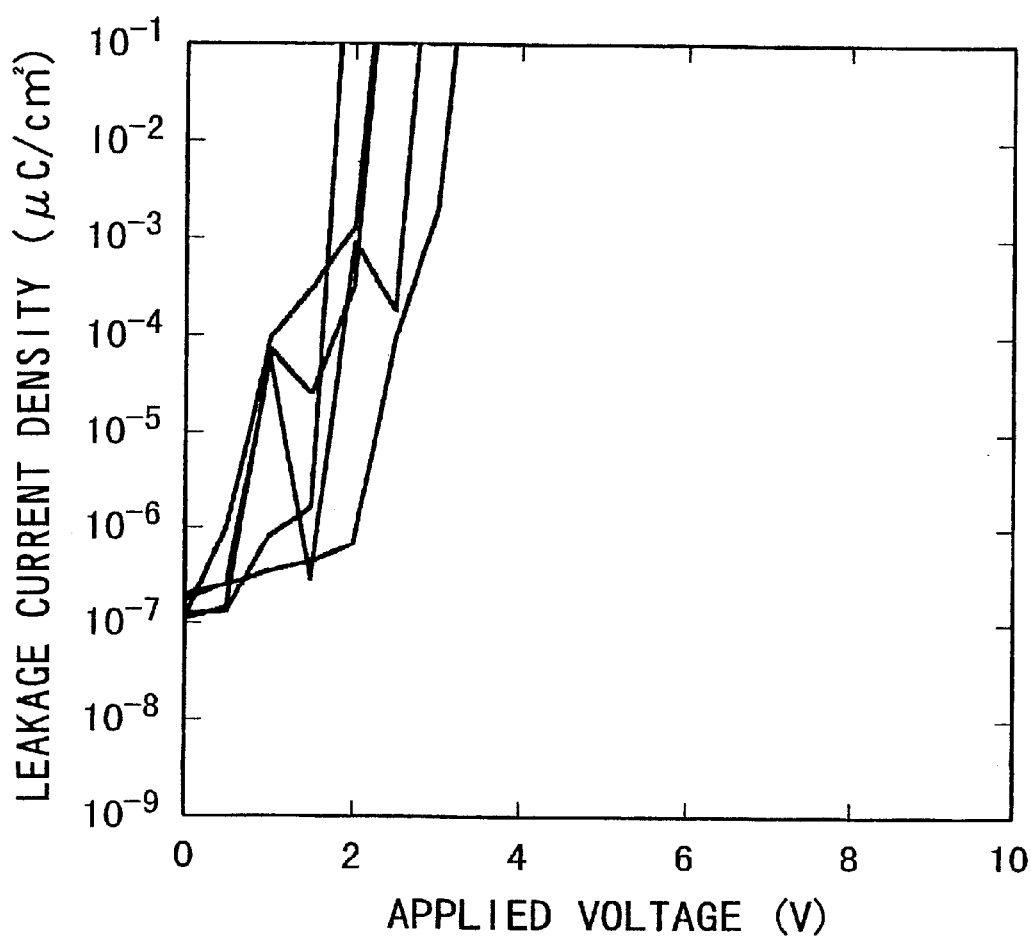
FIG. 8 is a graph showing the current density of the storage capacitor in the semiconductor memory device fabricated by using a conventional sputtering method.
Figure 9:
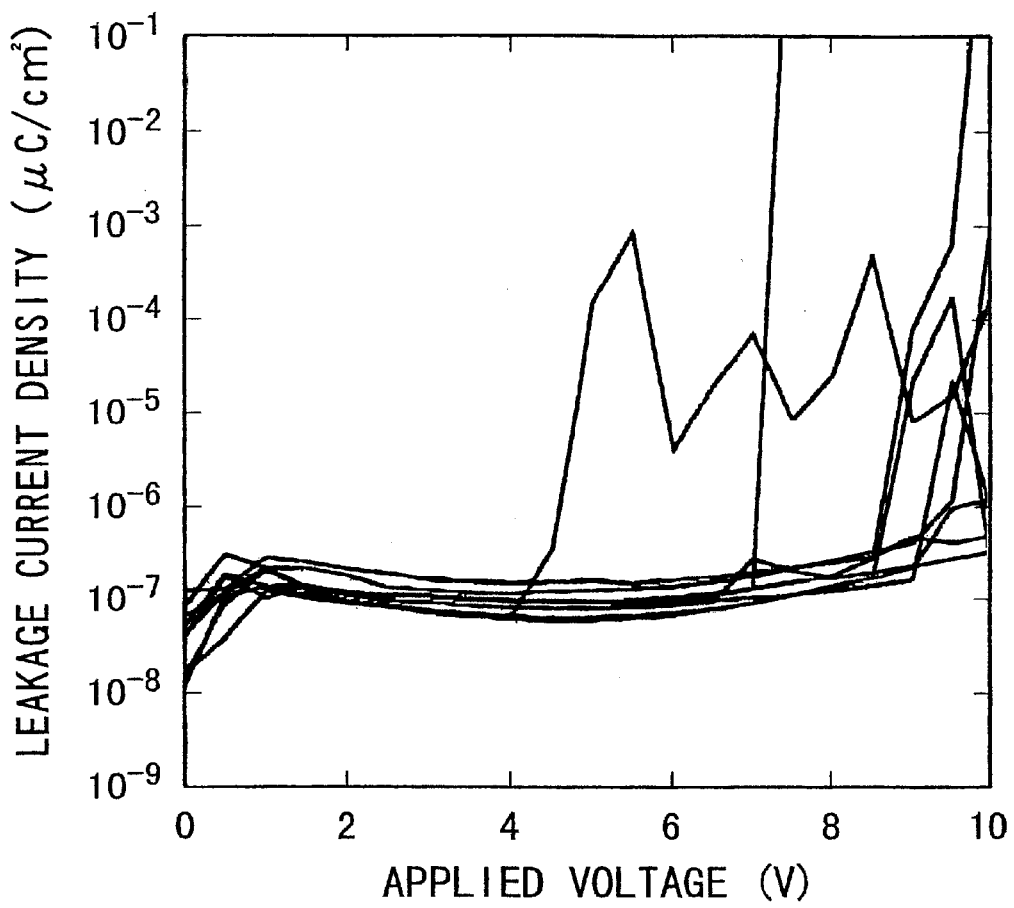
FIG. 9 is a graph showing the current density of the storage capacitor in the semiconductor memory device fabricated by the method according to the first embodiment.

FIG. 8 shows the leakage current density of the storage capacitor in the semiconductor memory devices fabricated by a conventional method, in which $CHF_3$ is used as the etching gas for the contact holes 11a and 11b. FIG. 9 shows the current density of the storage capacitor in the semiconductor memory device fabricated by the method according to the first embodiment, in which $CF_4$ is used as the etching gas for the contact holes 11a and 11b.

It is seen from FIG. 8 that the leakage current drastically increases at a voltage as low as approximately 2 V in the conventional etching method using $CHF_3$. In other words, the dielectric breakdown resistance is equal to approximately 2 V in the conventional etching method using $CHF_3$.

On the other hand, it is seen from FIG. 9 that the leakage current is kept sufficiently low at a voltage of approximately 5 V or lower in the etching method using $CF_4$ according to the first embodiment. In other words, the dielectric breakdown resistance is equal to at lowest approximately 5 V, and almost all the samples has the dielectric breakdown resistance of approximately 10 V or higher in the method according to the first embodiment.

It is needless to say that the etching process for the contact holes 11a and 11b may be applied to any other etching process such as etch back processes for surface planarization, damascene etching for wiring, and hard-mask etching processes for wiring.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A method of fabricating a semiconductor device, comprising the steps in sequence of:
   (a) forming a lower electrode of a capacitor on a first insulating film;
      said first insulating film being formed on or over a semiconductor substrate;
   (b) forming a dielectric film of said capacitor on said lower electrode to be overlapped therewith;
   (c) forming an upper electrode of said capacitor on said dielectric film to be overlapped therewith; and
   (d) forming a second insulating film to cover said capacitor by a thermal CVD process in an atmosphere containing no plasma at a temperature of said substrate in which hydrogen is prevented from being activated due to heat;
      a source material of said second insulating film having a property that no hydrogen is generated in said atmosphere through decomposition of said source material during said thermal CVD process.

2. A method as claimed in claim 1, wherein said second insulating film is $SiN_x$, and said temperature of said substrate in said forming step (d) is in a range of 500 to 750° C.

3. A method as claimed in claim 2, wherein said source material of said second insulating film comprises one selected from the group consisting of $[Si(NMe_2)_{4-n}H_n]$, $[(CH_3)_3SiOSi(CH_3)_3]$, $[Si(OC_3H_7)_2(OCOCH_3)_2]$, and $Si(NCO)_4$, where n is zero or a natural number.

4. A method as claimed in claim 2, wherein said source material of said second insulating film comprises $[Si(NMe_2)_{4-n}H_n]$, where n is zero or a natural number.

* * * * *

UNITED STATES PATENT AND TRADEMARK OFFICE
CERTIFICATE OF CORRECTION

PATENT NO.     : 6,709,991 B1
DATED          : March 23, 2004
INVENTOR(S)    : Kawahara et al.

It is certified that error appears in the above-identified patent and that said Letters Patent is hereby corrected as shown below:

<u>Column 14,</u>
Line 24, "insulating film to cover" should be -- insulating film consisting of SiNx to cover --.
Lines 33-34, delete the words -- said second insulating film SiNx, and -- after the word "wherein".

Signed and Sealed this

Fifth Day of April, 2005

JON W. DUDAS
*Director of the United States Patent and Trademark Office*